United States Patent
Yee et al.

(10) Patent No.: US 9,761,513 B2
(45) Date of Patent: Sep. 12, 2017

(54) METHOD OF FABRICATING THREE DIMENSIONAL INTEGRATED CIRCUIT

(71) Applicant: Taiwan Semiconductor Manufacturing Company, Ltd., Hsin-Chu (TW)

(72) Inventors: Kuo-Chung Yee, Taoyuan (TW); Chun Hui Yu, Zhubei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 4 days.

(21) Appl. No.: 14/266,261

(22) Filed: Apr. 30, 2014

(65) Prior Publication Data
US 2014/0231991 A1    Aug. 21, 2014

Related U.S. Application Data

(62) Division of application No. 13/452,636, filed on Apr. 20, 2012, now Pat. No. 8,741,691.

(51) Int. Cl.
*H01L 23/498* (2006.01)
*H01L 23/31* (2006.01)
(Continued)

(52) U.S. Cl.
CPC ...... *H01L 23/49811* (2013.01); *H01L 21/561* (2013.01); *H01L 21/563* (2013.01);
(Continued)

(58) Field of Classification Search
CPC ....... H01L 23/498; H01L 23/00; H01L 24/10; H01L 24/81
(Continued)

(56) References Cited

U.S. PATENT DOCUMENTS

| 4,811,082 A | 3/1989 | Jacobs et al. |
| 4,990,462 A | 2/1991 | Sliwa, Jr. |

(Continued)

FOREIGN PATENT DOCUMENTS

| KR | 100368985 B1 | 1/2003 |
| KR | 20110020951 A | 3/2011 |

(Continued)

OTHER PUBLICATIONS

Yu, A. et al., "Three Dimensional Interconnects with High Aspect Ratio TSVs and Fine Pitch Solder Microbumps," IEEE Electronic Components and Technology Conference, 2009, 5 pages.

(Continued)

*Primary Examiner* — Julio J Maldonado
*Assistant Examiner* — Rodolfo D Fortich
(74) *Attorney, Agent, or Firm* — Slater Matsil, LLP

(57) ABSTRACT

A method of fabricating a three dimensional integrated circuit comprises forming a redistribution layer on a first side of a packaging component, forming a holding chamber in the redistribution layer, attaching an integrated circuit die on the first side of the packaging component, wherein an interconnect bump of the integrated circuit die is inserted into the holding chamber, applying a reflow process to the integrated circuit die and the packaging component and forming an encapsulation layer on the packaging component.

19 Claims, 13 Drawing Sheets

(51) Int. Cl.
*H01L 21/56* (2006.01)
*H01L 23/00* (2006.01)

(52) U.S. Cl.
CPC .......... *H01L 21/565* (2013.01); *H01L 21/568* (2013.01); *H01L 23/3128* (2013.01); *H01L 23/49827* (2013.01); *H01L 23/49894* (2013.01); *H01L 24/10* (2013.01); *H01L 24/81* (2013.01); *H01L 24/97* (2013.01); *H01L 2224/10* (2013.01); *H01L 2224/16* (2013.01); *H01L 2224/16225* (2013.01); *H01L 2224/81* (2013.01); *H01L 2224/97* (2013.01); *H01L 2924/157* (2013.01); *H01L 2924/15311* (2013.01); *H01L 2924/15788* (2013.01); *H01L 2924/181* (2013.01); *H01L 2924/351* (2013.01)

(58) Field of Classification Search
USPC .................. 257/737, 777, 678, 778, 724
See application file for complete search history.

(56) References Cited

U.S. PATENT DOCUMENTS

| | | | |
|---|---|---|---|
| 5,075,253 A | 12/1991 | Sliwa, Jr. | |
| 5,380,681 A | 1/1995 | Hsu | |
| 5,481,133 A | 1/1996 | Hsu | |
| 6,002,177 A | 12/1999 | Gaynes et al. | |
| 6,187,678 B1 | 2/2001 | Gaynes et al. | |
| 6,229,216 B1 | 5/2001 | Ma et al. | |
| 6,236,115 B1 | 5/2001 | Gaynes et al. | |
| 6,271,059 B1 | 8/2001 | Bertin et al. | |
| 6,279,815 B1 | 8/2001 | Correia et al. | |
| 6,355,501 B1 | 3/2002 | Fung et al. | |
| 6,434,016 B2 | 8/2002 | Zeng et al. | |
| 6,448,661 B1 | 9/2002 | Kim et al. | |
| 6,461,895 B1 | 10/2002 | Liang et al. | |
| 6,562,653 B1 | 5/2003 | Ma et al. | |
| 6,570,248 B1 | 5/2003 | Ahn et al. | |
| 6,600,222 B1 | 7/2003 | Levardo | |
| 6,607,938 B2 | 8/2003 | Kwon et al. | |
| 6,661,085 B2 | 12/2003 | Kellar et al. | |
| 6,762,076 B2 | 7/2004 | Kim et al. | |
| 6,790,748 B2 | 9/2004 | Kim et al. | |
| 6,887,769 B2 | 5/2005 | Kellar et al. | |
| 6,908,565 B2 | 6/2005 | Kim et al. | |
| 6,908,785 B2 | 6/2005 | Kim | |
| 6,924,551 B2 | 8/2005 | Rumer et al. | |
| 6,943,067 B2 | 9/2005 | Greenlaw | |
| 6,946,384 B2 | 9/2005 | Kloster et al. | |
| 6,975,016 B2 | 12/2005 | Kellar et al. | |
| 7,037,804 B2 | 5/2006 | Kellar et al. | |
| 7,056,807 B2 | 6/2006 | Kellar et al. | |
| 7,087,538 B2 | 8/2006 | Staines et al. | |
| 7,151,009 B2 | 12/2006 | Kim et al. | |
| 7,157,787 B2 | 1/2007 | Kim et al. | |
| 7,215,033 B2 | 5/2007 | Lee et al. | |
| 7,276,799 B2 | 10/2007 | Lee et al. | |
| 7,279,795 B2 | 10/2007 | Periaman et al. | |
| 7,307,005 B2 | 12/2007 | Kobrinsky et al. | |
| 7,317,256 B2 | 1/2008 | Williams et al. | |
| 7,320,928 B2 | 1/2008 | Kloster et al. | |
| 7,345,350 B2 | 3/2008 | Sinha | |
| 7,402,442 B2 | 7/2008 | Condorelli et al. | |
| 7,402,515 B2 | 7/2008 | Arana et al. | |
| 7,410,884 B2 | 8/2008 | Ramanathan et al. | |
| 7,432,592 B2 | 10/2008 | Shi et al. | |
| 7,494,845 B2 | 2/2009 | Hwang et al. | |
| 7,528,494 B2 | 5/2009 | Furukawa et al. | |
| 7,531,890 B2 | 5/2009 | Kim | |
| 7,557,597 B2 | 7/2009 | Anderson et al. | |
| 7,576,435 B2 | 8/2009 | Chao | |
| 7,834,450 B2 | 11/2010 | Kang | |
| 8,084,871 B2 | 12/2011 | Rahim et al. | |
| 2005/0104228 A1* | 5/2005 | Rigg | H01L 21/76898 257/786 |
| 2008/0026560 A1 | 1/2008 | Nair et al. | |
| 2009/0189296 A1 | 7/2009 | Wu et al. | |
| 2011/0156250 A1 | 6/2011 | Goh et al. | |
| 2011/0186992 A1 | 8/2011 | Wu et al. | |
| 2011/0285005 A1 | 11/2011 | Lin et al. | |
| 2012/0119373 A1* | 5/2012 | Hunt | H01L 21/565 257/774 |
| 2012/0184099 A1 | 7/2012 | Souter | |
| 2012/0326325 A1* | 12/2012 | Choi et al. | 257/774 |
| 2013/0105991 A1 | 5/2013 | Gan et al. | |

FOREIGN PATENT DOCUMENTS

| | | |
|---|---|---|
| TW | 201128750 A1 | 8/2011 |
| WO | 2010008689 A2 | 1/2010 |

OTHER PUBLICATIONS

Huang, S-Y., et al., "Reliability assessment of the 20 um pitch micro-joints within a 3DIC assembly under various environments," Assembly and Reliability Technology Department, Packaging Technology Division, EOL, ITRI, 4 pages.

Joshi, M., et al., "CuBOL (Cu-Column on BOL) Technology: A Low Cost Flip Chip Solution Scalable to High I/O Density, Fine Bump Pitch and Advanced Si-Nodes," IEEE Electronic Components and Technology Conference, 2011, 7 pages.

* cited by examiner

METHOD OF FABRICATING THREE DIMENSIONAL INTEGRATED CIRCUIT

This application is a divisional of U.S. patent application Ser. No. 13/452,636, entitled "Method of Fabricating Three Dimensional Integrated Circuit," filed on Apr. 20, 2012, which application is incorporated herein by reference.

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area. As the demand for even smaller electronic devices has grown recently, there has grown a need for smaller and more creative packaging techniques of semiconductor dies.

As semiconductor technologies evolve, three dimensional integrated circuits have emerged as an effective alternative to further reduce the physical size of a semiconductor chip. In a three dimensional integrated circuit, active circuits such as logic, memory, processor circuits and the like are fabricated on different wafers and each wafer die is stacked on top of a packaging component using pick-and-place techniques. Much higher density can be achieved by employing three dimensional integrated circuits. In sum, three dimensional integrated circuits can achieve smaller form factors, cost-effectiveness, increased performance and lower power consumption.

A three dimensional integrated circuit may comprise an integrated circuit die, an interposer and a package substrate. More particularly, the integrated circuit die is attached to a first side of the interposer through a plurality of solder bumps. Solder bumps are used to provide electrical connection between the integrated circuit die and the interposer. A second side of the interposer is attached to the package substrate by a plurality of interconnect bumps. Interconnect bumps such as solder balls may provide electrical connection between the interposer and the package substrate, which in turn makes electrical connection to a printed circuit board through a plurality of package leads.

In order to reduce the potential solder failure between the integrated circuit die and the package substrate caused by thermal stresses, the interposer is employed to provide a matching coefficient of thermal expansion to the integrated circuit die. The interposer also provides adaptation between smaller contact pads with reduced pitch on an integrated circuit die and larger contact pads with increased pitch on a package substrate. In addition, the interposer may further comprise a variety of circuit elements. These circuit elements may be active, passive, or a combination of active and passive elements.

Three dimensional integrated circuits have some advantages. One advantageous feature of packaging multiple semiconductor dies vertically is that three dimensional package techniques may reduce fabrication costs. Another advantageous feature of three dimensional semiconductor devices is that parasitic losses are reduced by employing various interconnect bumps.

BRIEF DESCRIPTION OF THE DRAWINGS

For a more complete understanding of the present disclosure, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the various embodiments and are not necessarily drawn to scale.

DETAILED DESCRIPTION

The making and using of the present embodiments are discussed in detail below. It should be appreciated, however, that the present disclosure provides many applicable inventive concepts that can be embodied in a wide variety of specific contexts. The specific embodiments discussed are merely illustrative of specific ways to make and use the embodiments of the disclosure, and do not limit the scope of the disclosure.

The present disclosure will be described with respect to embodiments in a specific context, a three dimensional integrated circuit. The embodiments of the disclosure may also be applied, however, to a variety of semiconductor devices. Hereinafter, various embodiments will be explained in detail with reference to the accompanying drawings.

Figure 1:
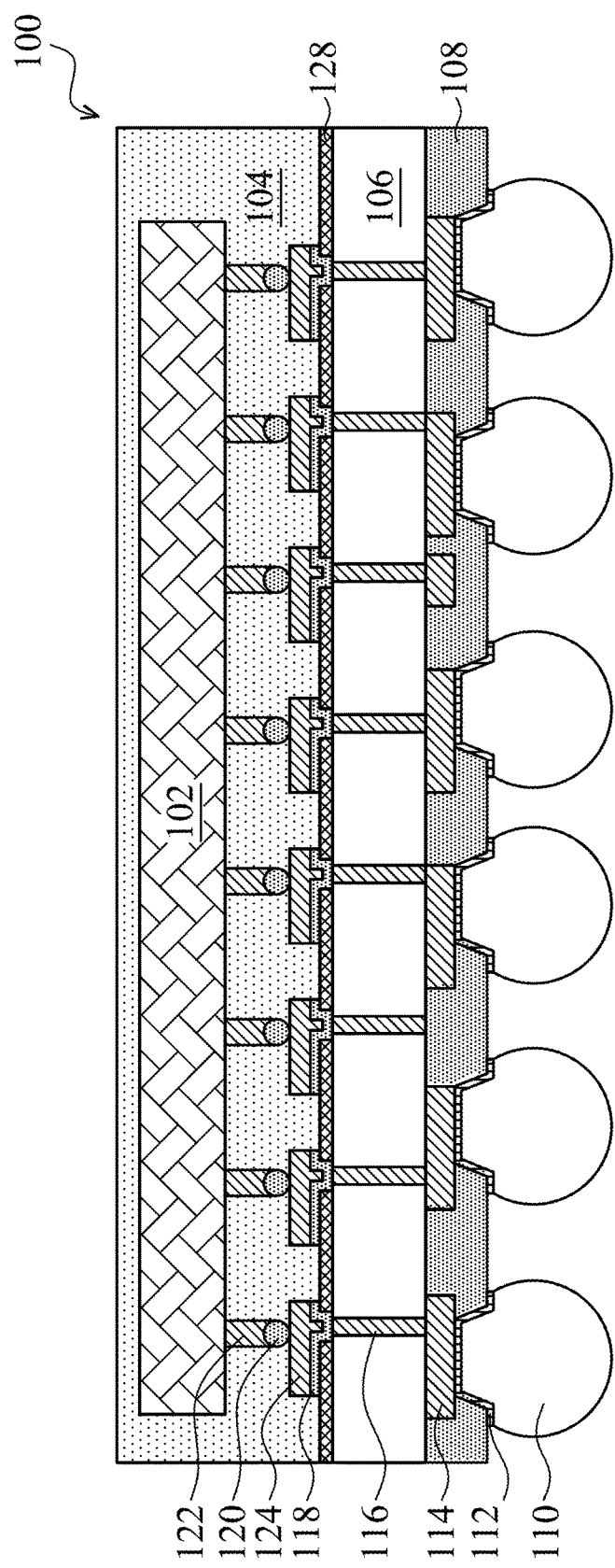
FIG. 1 illustrates a cross sectional view of a three dimensional integrated circuit in accordance with an embodiment.

FIG. 1 illustrates a cross sectional view of a three dimensional integrated circuit in accordance with an embodiment. A three dimensional integrated circuit 100 may comprise an integrated circuit die 102 stacked on a package component 106. As shown in FIG. 1, the integrated circuit die 102 is attached to a first side of the package component 106 through a plurality of interconnect components including metal pillar bumps 122, micro bumps 120 and redistribution layers 124. In addition, there may be an encapsulation layer 104 formed on top of the packaging component 106. In particular, the integrated circuit 102 and the interconnect components (e.g., micro bumps 120 and redistribution layer 124) are embedded in the encapsulation layer 104.

In accordance with an embodiment, the packaging component 106 may be an interposer. For simplicity, throughout the description, the packaging component 106 may be alternatively referred to as an interposer 106. The interposer 106 may be made of silicon, glass and/or the like. As shown in FIG. 1, the interposer 106 may comprise a plurality of vias 116 embedded in the interposer 106. The interposer 106 may further comprise a first side redistribution layer 124 formed on top of a seed layer 118 over the first side of the interposer 106. After the integrated circuit dies 102 is bonded on the interposer 106, the active circuits of the integrated circuit die 102 are coupled to the vias of the interposer 106 through a conductive channel formed by the seed layer 118, the redistribution layer 124, micro bumps 120 and the metal pillar bumps 122.

A second side of the interposer 106 may be attached to a package substrate (not shown) by a plurality of interconnect bumps 110. In accordance with an embodiment, these interconnect bumps 110 may be solder balls. As shown in FIG. 1, the redistribution layer 124 is connected to its corresponding through via 116 by a seed layer 118. Furthermore, the through via 116 is connected to its corresponding interconnect bump 110 through a redistribution layer 114 and an under bump metallization structure 112. As such, the metal pillar bump 122, solder ball 120, the redistribution layer 124, the seed layer 118, the through via 116, the redistribution layer 114, the under bump metallization structure 112 and the interconnect bump 110 may form a conductive path between the active circuits of the integrated circuit die 102 and the package substrate (not shown), which in turn makes electrical connection to a printed circuit board through a plurality of package leads.

Figure 2:
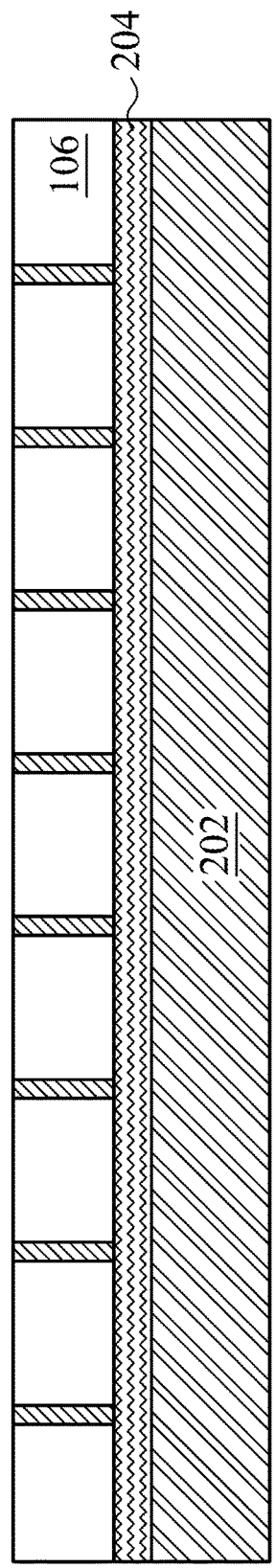
FIG. 2 illustrates a cross sectional view of placing an interposer on a carrier in accordance with an embodiment.

FIGS. 2-13 are cross sectional views of intermediate stages in the making of a three dimensional integrated circuit in accordance with an embodiment. FIG. 2 illustrates a cross sectional view of placing an interposer on a carrier in accordance with an embodiment. As shown in FIG. 2, a second side of the interposer 106 is mounted on the carrier 202. In particular, the second side of the interposer 106 is glued on top of the carrier 202 by employing an adhesive 204. In accordance with an embodiment, the adhesive 204 may be epoxy and/or the like.

The carrier 202 may be formed of a wide variety of materials comprising glass, silicon, ceramics, polymers and/or the like.

Figure 3:
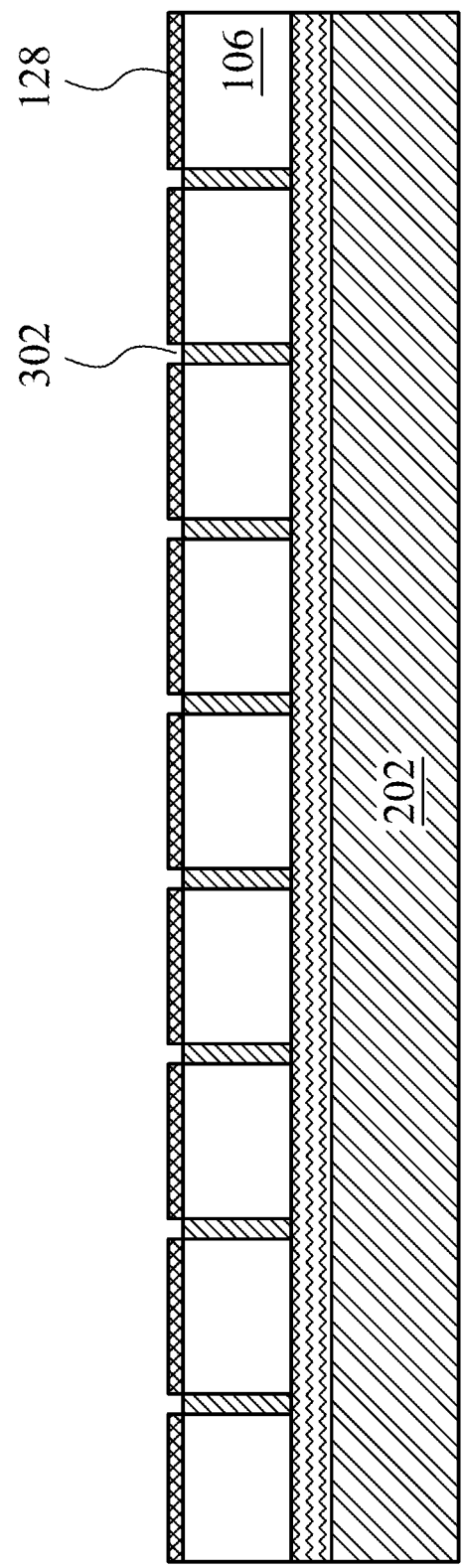
FIG. 3 illustrates a cross sectional view of forming a plurality of openings in a dielectric layer in accordance with an embodiment.

FIG. 3 illustrates a cross sectional view of forming a plurality of openings in a dielectric layer in accordance with an embodiment. A dielectric layer 128 is formed on top of the interposer 106. The dielectric material may comprise polybenzoxazole (PBO), SU-8 photo-sensitive epoxy, film type polymer materials and/or the like. In consideration of electrical and thermal needs, selective areas of the dielectric layer 128 are exposed to light. As a result, a variety of openings (e.g., opening 302) are formed. The formation of the openings such as opening 302 in the dielectric layer 128 involves lithography operations, which are well known, and hence are not discussed in further detail herein.

Figure 4:
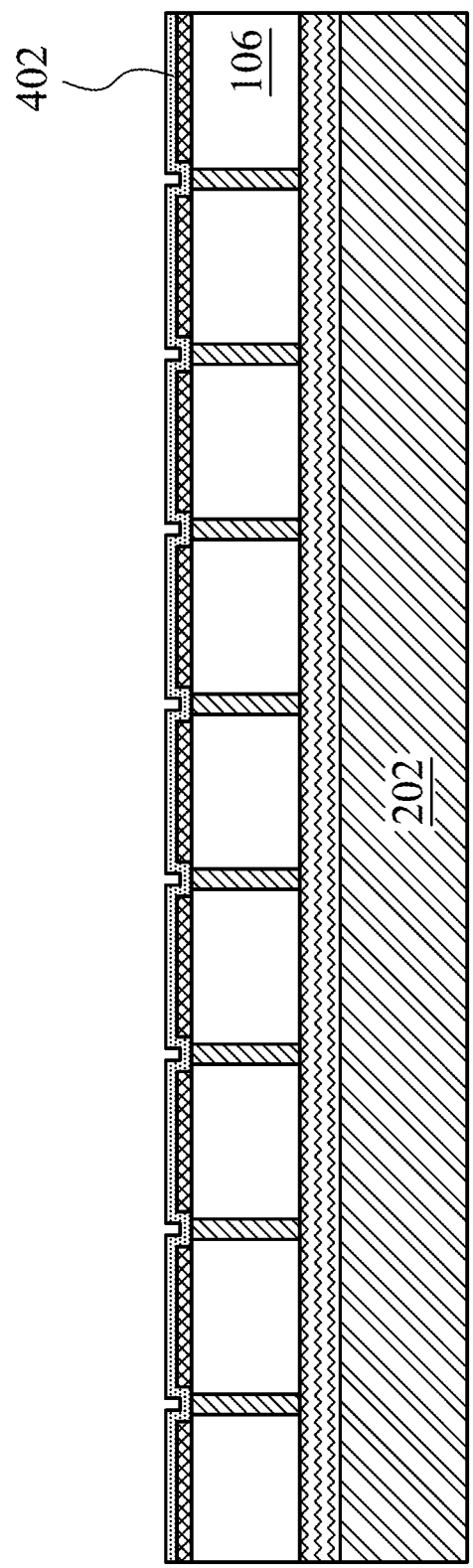
FIG. 4 illustrates a cross sectional view of the semiconductor device shown in FIG. 3 after a seed layer is formed on top of the dielectric layer in accordance with an embodiment.

FIG. 4 illustrates a cross sectional view of the semiconductor device shown in FIG. 3 after a seed layer is formed on top of the dielectric layer in accordance with an embodiment. In order to provide a nucleation site for the subsequent bulk metal deposition, a thin seed layer 402 is deposited on the dielectric layer 128. The thin seed layer 402 may comprise copper. The thin seed layer 402 may be implemented by using suitable fabrication techniques such as physical vapor deposition (PVD), chemical vapor deposition (CVD) or the like.

Figure 5:
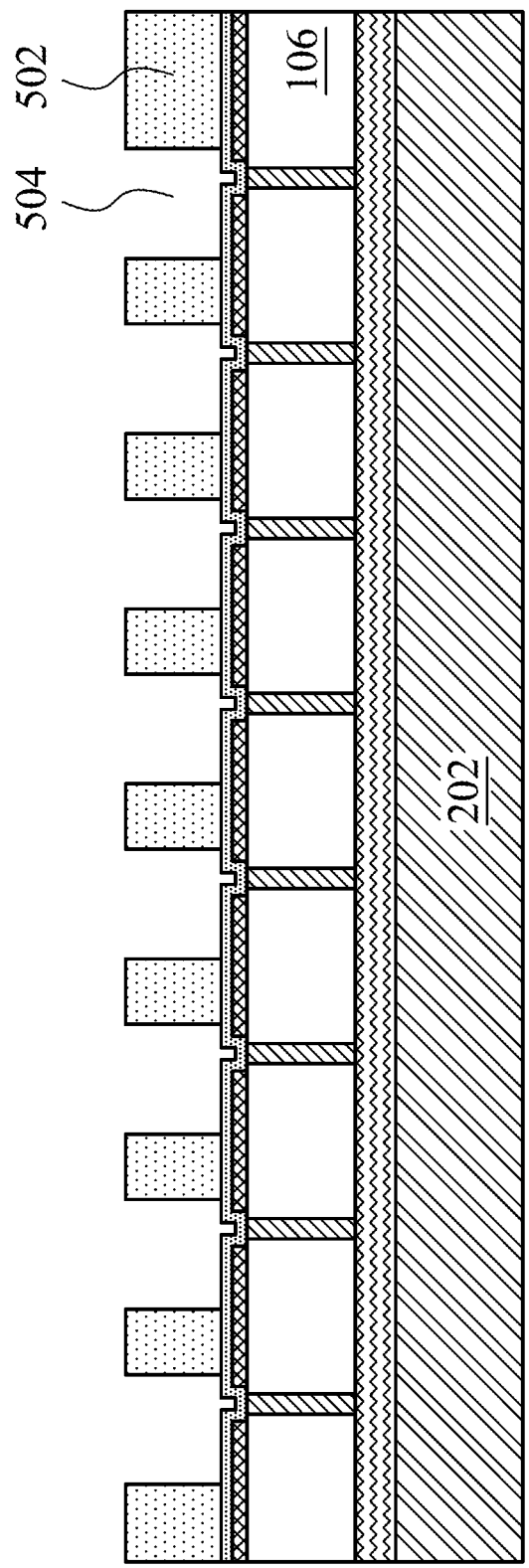
FIG. 5 illustrates a cross sectional view of forming a plurality of openings in a photoresist layer in accordance with an embodiment.

FIG. 5 illustrates a cross sectional view of forming a plurality of openings in a photoresist layer in accordance with an embodiment. A photoresist layer 502 is formed on top of the thin seed layer 402. The photoresist layer 502 may comprise SU-8 photo-sensitive epoxy, film type polymer materials and/or the like. In consideration of electrical needs, selective areas of the photoresist layer 502 are exposed to light. As a result, a variety of openings (e.g., opening 504) are formed.

Figure 6:
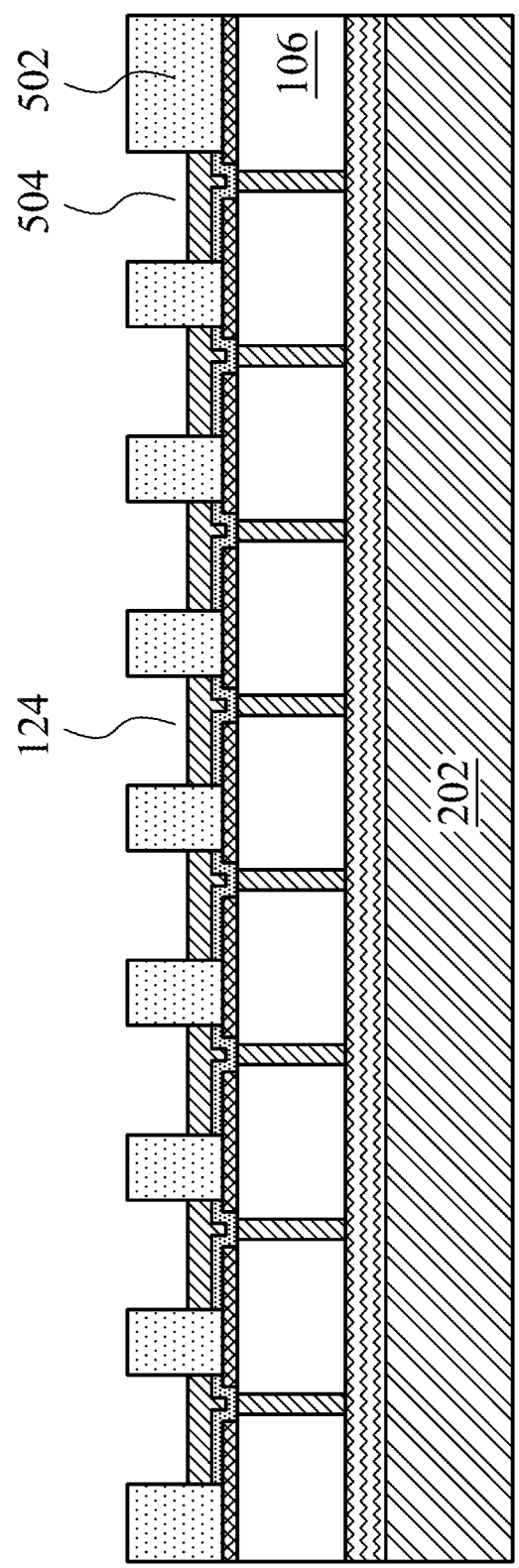
FIG. 6 illustrates a cross sectional view of the semiconductor device shown in FIG. 5 after a redistribution layer is formed on top of the seed layer in accordance with an embodiment.

FIG. 6 illustrates a cross sectional view of the semiconductor device shown in FIG. 5 after a redistribution layer is formed on top of the seed layer in accordance with an embodiment. As shown in FIG. 6, a conductive material fills the openings (e.g., opening 504) to form a redistribution layer 124. The conductive material may be copper, but can be any suitable conductive materials, such as copper alloys, aluminum, tungsten, silver and combinations thereof. The redistribution layer 124 may be formed by suitable techniques such as an electrochemical plating process.

Figure 7:
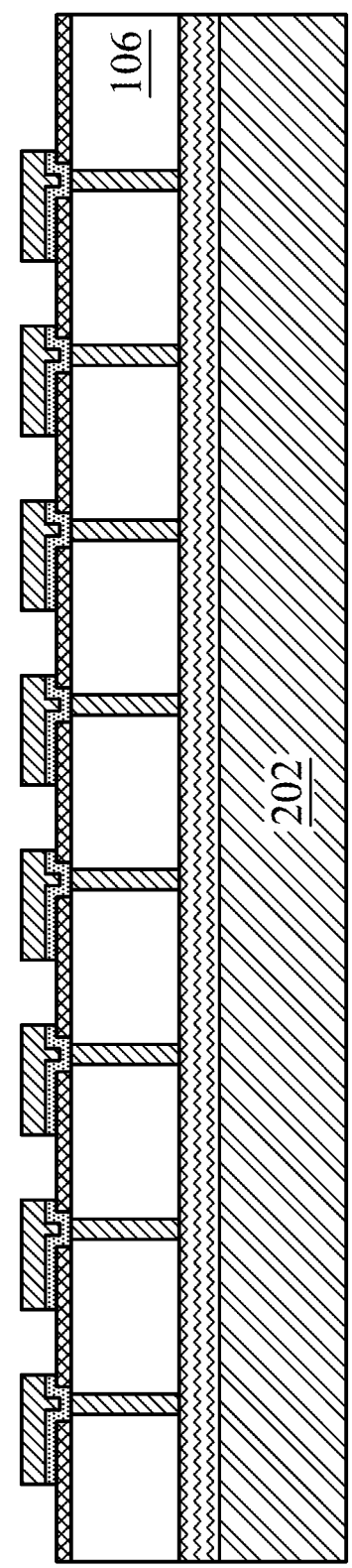
FIG. 7 illustrates a cross sectional view of the semiconductor device shown in FIG. 6 after the photoresist layer has been removed in accordance with an embodiment.

FIG. 7 illustrates a cross sectional view of the semiconductor device shown in FIG. 6 after the photoresist layer has been removed in accordance with an embodiment. The remaining photoresist layer 502 shown in FIG. 6 may be removed by using suitable photoresist stripping techniques such as plasma ashing, dry stripping and/or the like. The photoresist stripping techniques are well known and hence are not discussed in further detail herein to avoid repetition.

In accordance with an embodiment, a suitable etching process such as wet-etching or dry-etching may be applied to the exposed portion of the thin seed layer 402. As a result, the exposed portion of the thin seed layer 402 has been removed. The detailed operations of either the dry etching process or the wet etching process are well known, and hence are not discussed herein to avoid repetition.

It should be recognized that while FIG. 7 illustrates the interposer 106 with a single redistribution layer, the interposer 106 could accommodate any number of redistribution layers. The number of redistribution layers illustrated herein is limited solely for the purpose of clearly illustrating the inventive aspects of the various embodiments. The present disclosure is not limited to any specific number of redistribution layers.

Figure 8B:
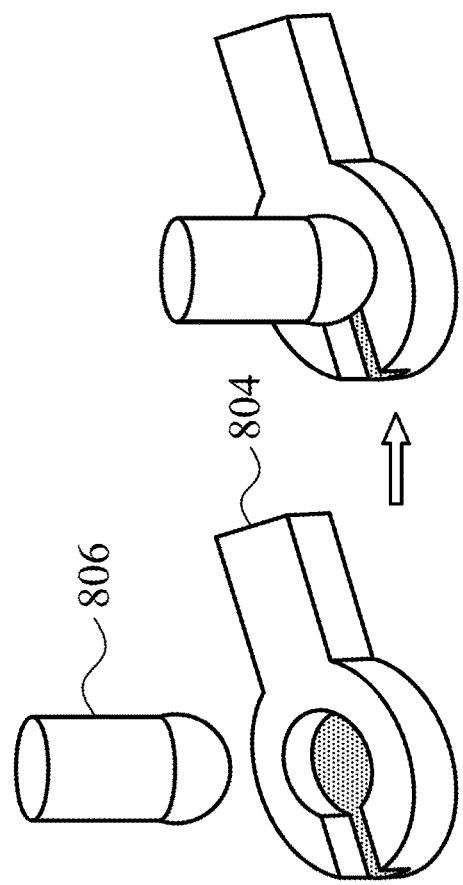
FIG. 8B illustrates a perspective view of placing a micro bump into a holding structure in accordance with an embodiment.
Figure 8A:
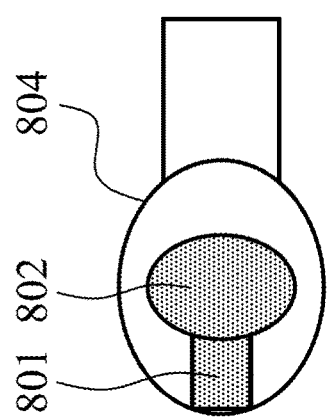
FIG. 8A illustrates a top view of a portion of a redistribution layer in accordance with an embodiment.

FIG. 8A illustrates a top view of a portion of a redistribution layer in accordance with an embodiment. The redistribution layer 804 may comprise a holding structure for accommodating a micro bump in the subsequent fabrication process. In accordance with an embodiment, the holding structure includes a holding chamber 802 and a trench 801. The holding chamber 802 may be a cavity having a circular shape so that the micro bump can fit into the holding chamber 802.

It should be noted that the cavity (e.g., the holding chamber 802) are substantially circular in shape as shown in FIG. 8A. It is within the scope and spirit of various embodiments for the cavity to comprise other shapes, such as, but no limited to oval, square, rectangular and the like.

Both the holding chamber 802 and the trench 801 may be formed by employing suitable patterning techniques. Referring back to FIG. 5, in order to form the trench 801 and the holding chamber 802, after patterning, photoresist materials may cover the portions of the holding chamber and the trench. As a result, during the fabrication step shown in FIG. 6, the metal material cannot fill the holding chamber and the trench. After a photoresist stripping process, the holding chamber 802 and the trench 801 are formed after the remaining photoresist materials in the holding chamber and the trench have been removed.

FIG. 8B illustrates a perspective view of placing a micro bump into a holding structure in accordance with an embodiment. The micro bump 806 has a round terminal. The cavity of the redistribution layer 804 can accommodate the round terminal of the micro bump 806. As such, when an integrated circuit die having micro bumps are bonded on an interposer, the micro bumps can be held by the cavities of the redistribution layer without bonding pads. In addition, the trench 801 is employed to provide a passage through which the solder and flux gases may flow during the subsequent reflowing process shown in FIG. 9.

One advantageous feature of having the holding structure shown in FIG. 8B is that the holding structure enables finer spacing between adjacent interconnects. In addition, by employing the holding structure without bonding pads, smaller keep-out zones can be achieved so as to reduce bump-to-bump clearance.

Figure 9:
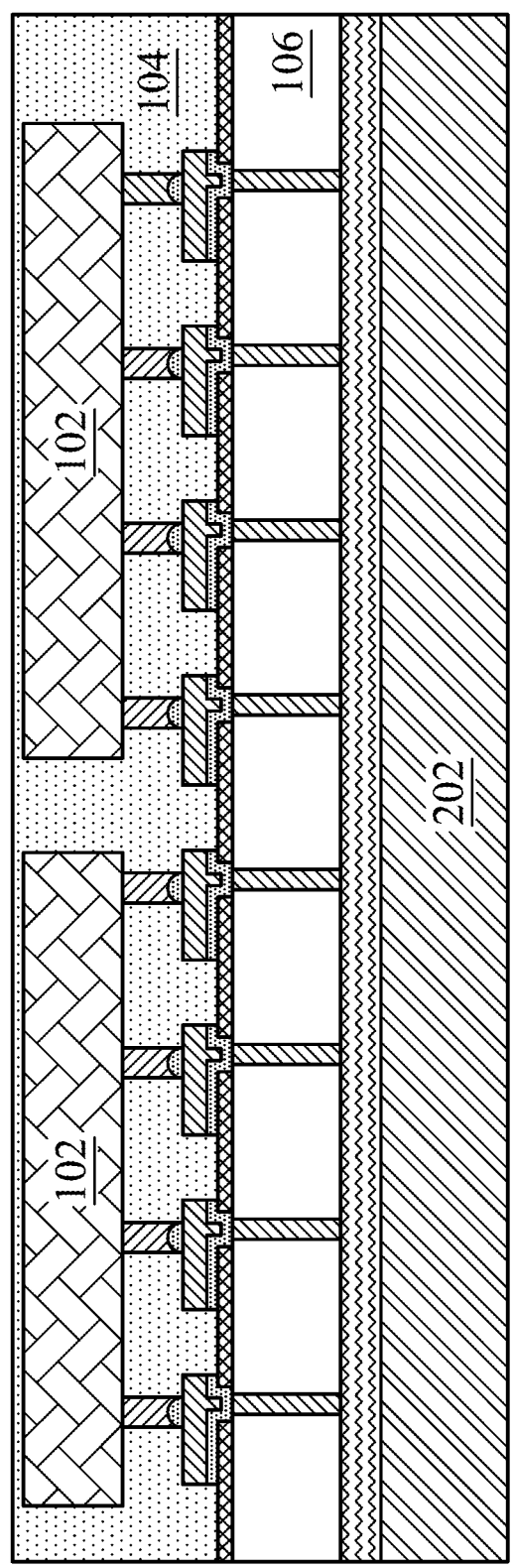
FIG. 9 illustrates a cross sectional view of the semiconductor device shown in FIG. 7 after an integrated circuit die is bonded on the interposer in accordance with an embodiment.

FIG. 9 illustrates a cross sectional view of the semiconductor device shown in FIG. 7 after an integrated circuit die is bonded on the interposer in accordance with an embodiment. An integrated circuit die 102 is mounted on the interposer 106. More particularly, each micro bump of the integrated circuit die 102 is inserted into a corresponding holding chamber in the redistribution layer (not shown but illustrated in FIG. 8B). A reflow process is performed so that the integrated circuit die 102 is connected to the interposer 106 through the melted micro bumps. Furthermore, an encapsulation layer 104 is formed on top of the interposer 106 to protect the top surface of the redistribution layer from erosion. In addition, the encapsulation layer 104 is thick enough to mechanically support the integrated circuit die 102 in the subsequent fabrication steps. As such, the three dimensional integrated circuit can be detached from the carrier 202.

FIG. 9 shows the integrated circuit die 102 without details. It should be noted that the integrated circuit die 102 may comprise basic semiconductor layers such as active circuit layers, substrate layers, inter-layer dielectric (ILD) layers and inter-metal dielectric (IMD) layers (not shown). The integrated circuit die 102 may comprise a silicon substrate. Alternatively, the integrated circuit die 102 may comprise a silicon-on-insulator substrate. The integrated circuit die 102 may further comprise a variety of electrical circuits (not shown). The electrical circuits formed in the integrated circuit die 102 may be any type of circuitry suitable for a particular application.

In accordance with an embodiment, the electrical circuits may include various n-type metal-oxide semiconductor (NMOS) and/or p-type metal-oxide semiconductor (PMOS) devices such as transistors, capacitors, resistors, diodes, photo-diodes, fuses and the like. The electrical circuits may be interconnected to perform one or more functions. The functions may include memory structures, processing structures, sensors, amplifiers, power distribution, input/output circuitry or the like. One of ordinary skill in the art will appreciate that the above examples are provided for illustrative purposes only to further explain applications of the present disclosure and are not meant to limit the present disclosure in any manner.

The encapsulation layer 104 may be formed of underfill materials. In accordance with an embodiment, the underfill material may be an epoxy, which is dispensed at the gap between the interposer 106 and the integrated circuit die 102. The epoxy may be applied in a liquid form, and may harden after a curing process. In accordance with another embodiment, encapsulation layer 104 may be formed of curable materials such as polymer based materials, resin based materials, polyimide, epoxy and any combinations of thereof. The encapsulation layer 104 can be formed by a spin-on coating process, dry film lamination process and/or the like.

Alternatively, the encapsulation layer 104 may be a molding compound layer formed on top of the wafer stack. The molding compound layer may be formed of curable materials such as polymer based materials, resin based materials, polyimide, epoxy and any combinations of thereof. The molding compound layer can be formed by a spin-on coating process, an injection molding process and/or the like. In order to reliably handle the integrated circuit die 102 mounted on top of the interposer 106 during subsequent fabrication process steps such as a backside fabrication process of the interposer 106, the molding compound layer is employed to keep the interposer 106 and the integrated circuit die 102 on top of the interposer 106 from cracking, bending, warping and/or the like.

Figure 10:
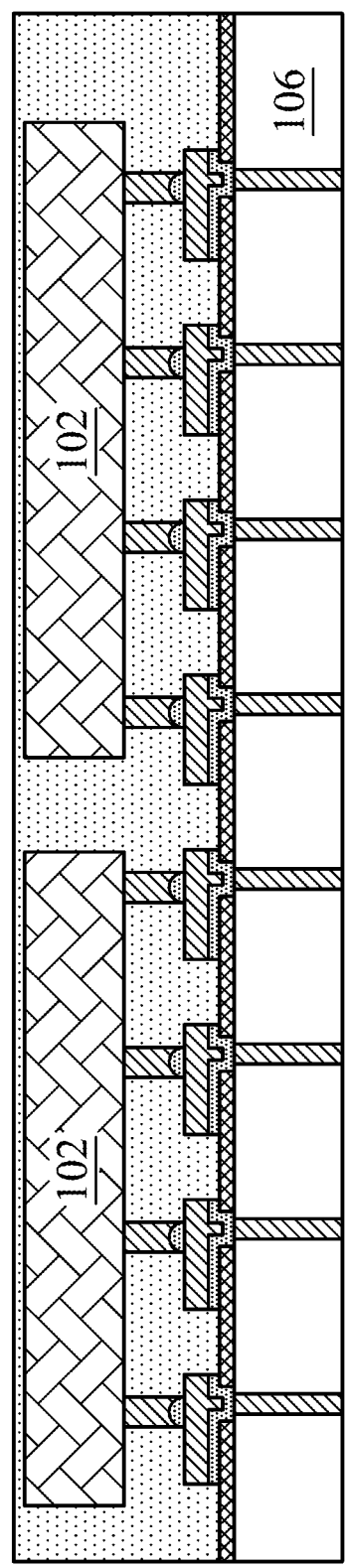
FIG. 10 illustrates a process of removing the carrier from the semiconductor device shown in FIG. 9.

FIG. 10 illustrates a process of removing the carrier from the semiconductor device shown in FIG. 9. In accordance with an embodiment, the carrier 202 can be detached from the three dimensional integrated circuit including the integrated circuit die 102 and the interposer 106. A variety of detaching processes may be employed to separate the three dimensional integrated circuit from the carrier 202. The variety of detaching processes may comprise a chemical solvent, a UV exposure and the like.

Figure 11:
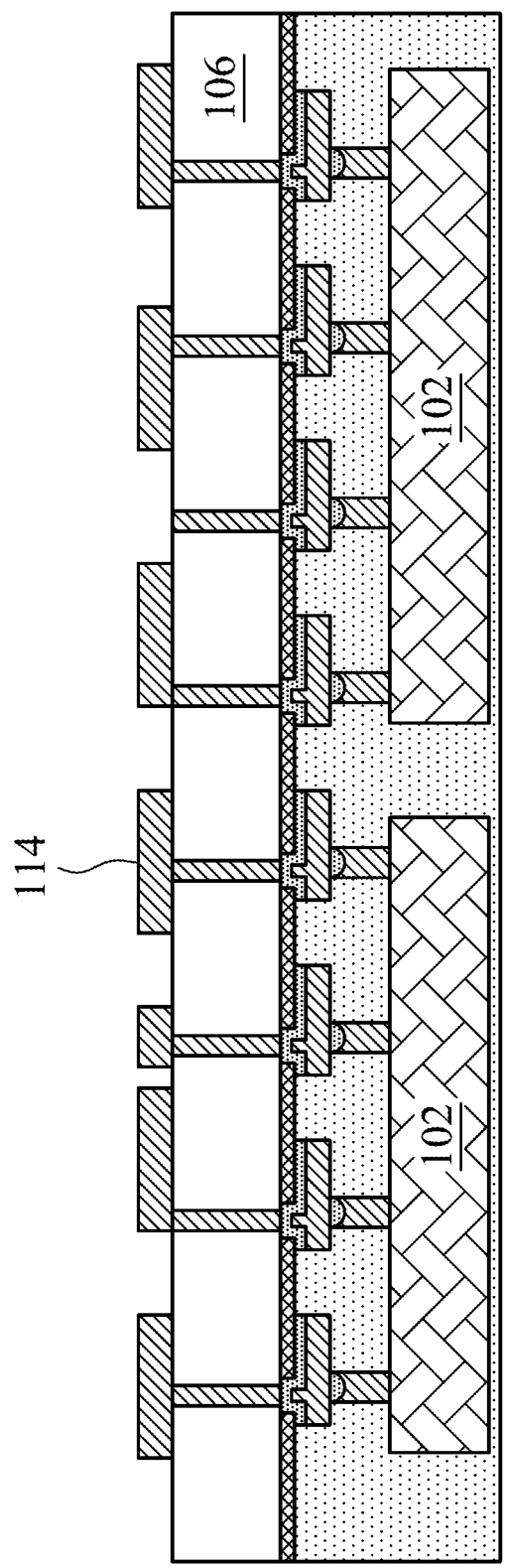
FIG. 11 illustrates a cross sectional view of the semiconductor device shown in FIG. 10 after a redistribution layer is formed on the second side of the interposer.

FIG. 11 illustrates a cross sectional view of the semiconductor device shown in FIG. 10 after a redistribution layer is formed on the second side of the interposer. The redistribution layer 114 is formed of conductive materials such as copper, copper alloys, aluminum, tungsten, silver and combinations thereof. The formation of a redistribution layer has been described above with respect to FIGS. 5-7, and hence is not discussed in further detail to avoid unnecessary repetition.

Figure 12:
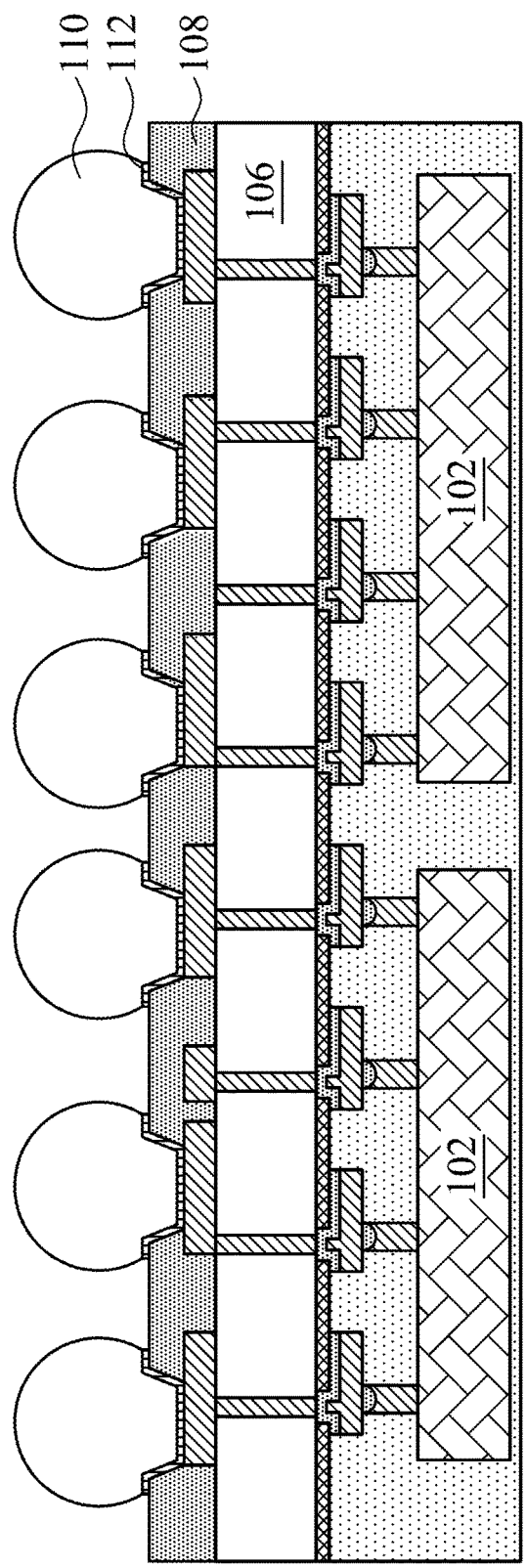
FIG. 12 illustrates a cross section view of the semiconductor device shown in FIG. 11 after a plurality of under bump metallization structures have been formed in accordance with an embodiment.

FIG. 12 illustrates a cross section view of the semiconductor device shown in FIG. 11 after a plurality of under bump metallization structures have been formed in accordance with an embodiment. A dielectric layer 108 is formed over the redistribution layer 114. A plurality of under bump metallization structures 112 may be formed on top of the redistribution layers 114. The under bump metallization structures 112 may help to prevent diffusion between the interconnect bumps 110 and the interposer 106, while providing a low resistance electrical connection.

A plurality of interconnect bumps 110 are formed on the under bump metallization structures 112. The interconnect bumps 110 provide an effective way to connect the three dimensional integrated circuit with external circuits (not shown). In accordance with an embodiment, the interconnect bumps 110 may be a plurality of solder balls. Alternatively, the interconnect bumps 110 may be a plurality of land grid array (LGA) pads.

Figure 13:
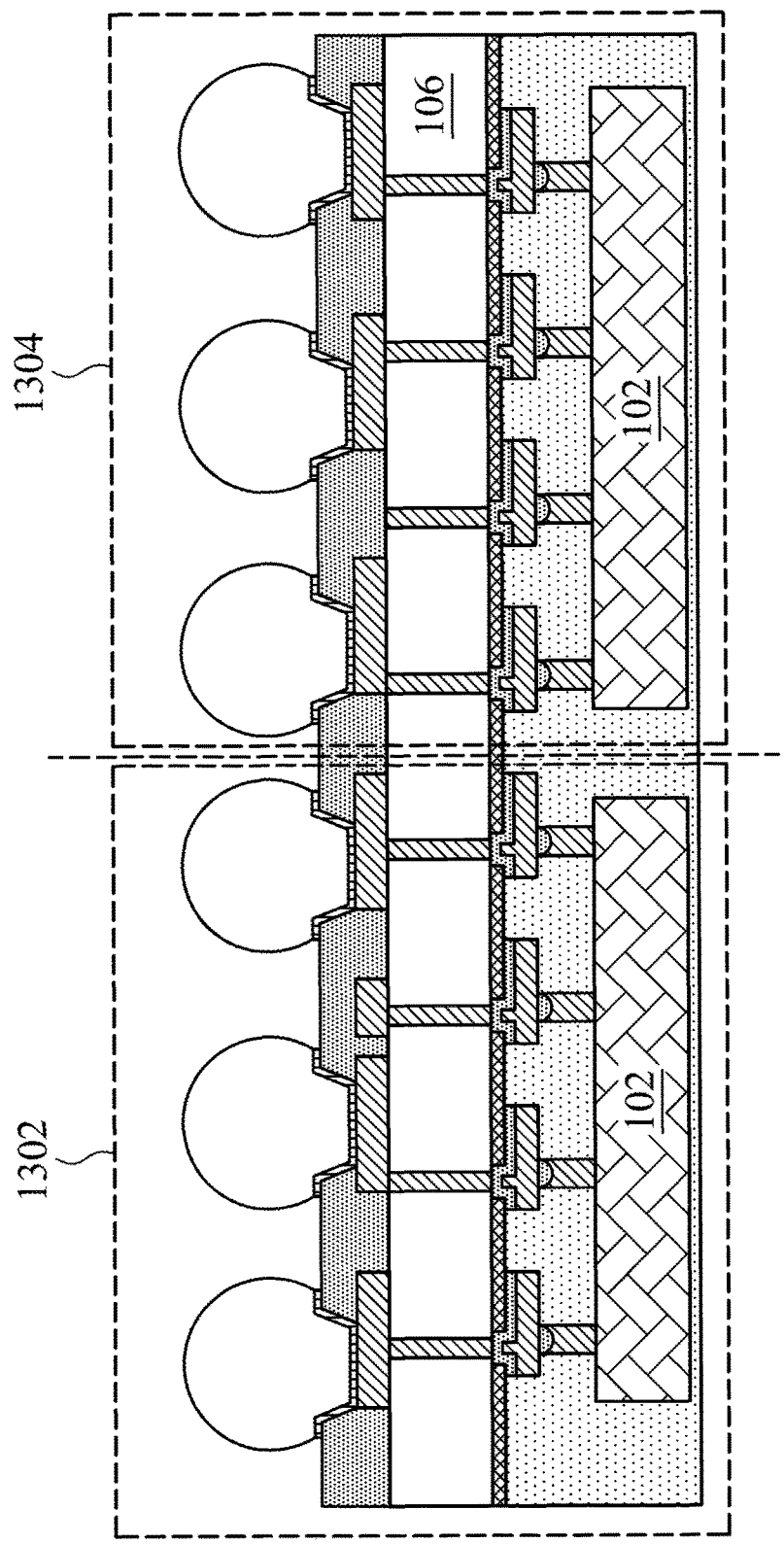
FIG. 13 illustrates a process of separating the semiconductor device shown in FIG. 12 into individual chip packages using a dicing process.

FIG. 13 illustrates a process of separating the semiconductor device shown in FIG. 12 into individual chip packages 1302 and 1304 using a dicing process. The dicing process is well known in the art, and hence is not discussed in detail herein.

Although embodiments of the present disclosure and its advantages have been described in detail, it should be understood that various changes, substitutions and alterations can be made herein without departing from the spirit and scope of the disclosure as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A device comprising:
a semiconductor die stacked on a packaging component;
a first redistribution layer formed on a first side of the packaging component, wherein the first redistribution layer comprises:
 a cavity configured to accommodate a corresponding interconnect bump of the semiconductor die; and
 a trench connected to the cavity, wherein a bottom surface of the trench is level with a bottom surface of the cavity; and
an encapsulation layer formed on the packaging component, wherein the semiconductor die is embedded in the encapsulation layer.

2. The device of claim 1, further comprising:
a second redistribution layer formed on a second side of the packaging component;
an under bump metallization structure formed on the second redistribution layer; and
a second interconnect bump formed on the under bump metallization structure.

3. The device of claim 2, wherein the packaging component is an interposer comprising a through via coupled between the first redistribution layer and the second redistribution layer.

4. The device of claim 1, further comprising:
a metal pillar bump formed on the semiconductor die; and
a first interconnect bump formed on the metal pillar bump.

5. The device of claim 1, further comprising:
a first dielectric layer formed on the first side of the packaging component; and
a seed layer formed between the first redistribution layer and the first dielectric layer.

6. The device of claim 1, wherein the cavity is of a circular or oval shape.

7. An apparatus comprising:
a first redistribution layer having a first conductive feature on a first side of a packaging component;
a holding chamber in the first conductive feature, wherein the holding chamber comprises a cavity and a trench extending away from the cavity in a plan view, and wherein a bottom surface of the trench is level with a bottom surface of the cavity, and wherein the holding chamber extends horizontally along a top surface of the packaging component and the cavity is wider than the trench; and
an integrated circuit die on the first side of the packaging component, wherein an interconnect bump of the integrated circuit die is in the holding chamber.

8. The apparatus of claim 7, wherein:
the cavity is of an oval shape.

9. The apparatus of claim 7, wherein:
the cavity is of a circular shape.

10. The apparatus of claim 7, further comprising:
an encapsulation layer on the first side of the packaging component.

11. The apparatus of claim 10, wherein:
the integrated circuit die is embedded in the encapsulation layer.

12. The apparatus of claim 7, further comprising:
a second redistribution layer on a second side of the packaging component;
an under bump metallization structure on the second redistribution layer; and
an interconnect bump on the under bump metallization structure.

13. The apparatus of claim 12, wherein:
the packaging component is an interposer.

14. A structure comprising:
a first front side redistribution layer having a holding structure, the holding structure being conductive wherein the first front side redistribution layer is on a first side of a packaging component, and wherein the holding structure comprises a cavity and a trench connected to the cavity, and wherein a bottommost surface of the trench is level with a bottommost surface of the cavity, and wherein the trench extends horizontally from the cavity in a direction orthogonal to a via extending vertically through the packaging component;
a semiconductor die on the first side of the packaging component, wherein a bump of the semiconductor die is in the holding structure; and
an encapsulation layer on the first side of the packaging component, wherein the semiconductor die is embedded in the encapsulation layer.

15. The structure of claim 14, wherein:
the cavity is of an oval shape.

16. The structure of claim 14, wherein:
the cavity is of a circular shape.

17. The structure of claim 14, wherein:
the packaging component is an interposer; and
the encapsulation layer is over the interposer.

18. The structure of claim 14, further comprising:
a second front side redistribution layer overlying the first front side redistribution layer.

19. The structure of claim 14, further comprising:
a first backside redistribution layer on a second side of the packaging component;
an under bump metallization structure on the first backside redistribution layer; and
an interconnect bump on the under bump metallization structure.

* * * * *